(12) United States Patent
Takashima et al.

(10) Patent No.: US 6,457,633 B1
(45) Date of Patent: Oct. 1, 2002

(54) METHOD OF FORMING A BGA-TYPE SEMICONDUCTOR DEVICE HAVING RELIABLE ELECTRICAL CONNECTION FOR SOLDER BALLS

(75) Inventors: Akira Takashima, Kawasaki; Kazuya Kamimura, Aizuwakamatsu; Yoshikazu Kumagaya, Kawasaki, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/274,764

(22) Filed: Mar. 24, 1999

(30) Foreign Application Priority Data

Aug. 26, 1998 (JP) .............................. 10-240650

(51) Int. Cl.7 .............................................. B23K 31/02
(52) U.S. Cl. ................... 228/248.1; 228/180.21
(58) Field of Search .......................... 228/123.1, 122.1, 228/124, 124.5, 179.1, 180, 180.21, 180.22, 245, 246, 248.1, 254; 438/613; 257/737, 738

(56) References Cited

U.S. PATENT DOCUMENTS

| | | | | |
|---|---|---|---|---|
| 4,830,264 A | * | 5/1989 | Bitaillou et al. | |
| 5,275,330 A | * | 1/1994 | Isaacs et al. | 228/180.2 |
| 5,722,160 A | * | 3/1998 | Uemura et al. | |
| 5,988,487 A | * | 11/1999 | MacKay et al. | 228/254 |
| 6,020,642 A | * | 2/2000 | Drynan | |
| 6,037,665 A | * | 3/2000 | Miyazaki | |
| 6,097,089 A | * | 8/2000 | Gaku et al. | |
| 6,163,071 A | * | 12/2000 | Yamamura | |
| 6,207,550 B1 | * | 3/2001 | Hase et al. | |

FOREIGN PATENT DOCUMENTS

JP          7-7258          1/1995

* cited by examiner

Primary Examiner—M. Alexandra Elve
Assistant Examiner—Jonathan Johnson
(74) Attorney, Agent, or Firm—Armstrong, Westerman & Hattori, LLP

(57) ABSTRACT

A method of forming a semiconductor device mounts solder balls on a resin board which has holes formed therethrough and conductive sheets formed therebeneath to cover bottom ends of the holes. The method includes the steps of applying solder paste on the holes, melting the solder paste by heat to make solder of the solder paste flow into the holes and establish contact with the conductive sheets, and connecting the solder balls to the solder filled in the holes.

4 Claims, 10 Drawing Sheets

METHOD OF FORMING A BGA-TYPE SEMICONDUCTOR DEVICE HAVING RELIABLE ELECTRICAL CONNECTION FOR SOLDER BALLS

BACKGROUND OF THE INVENTION

1. Field of the Invention

The present invention generally relates to a method of forming a semiconductor device, a method of forming a circuit board, and a semiconductor-device forming device. The present invention particularly relates to a method of forming a semiconductor device having solder balls thereof arranged at small holes formed in a board, and a method of forming a circuit board used in such a semiconductor device, and a semiconductor-device forming device for manufacturing such a semiconductor device.

In recent years, a fine-pitch BGA (ball-grid array) has been widely used to respond to the demand for miniaturization and increased circuit density of semiconductor devices.

The fine-pitch BGA includes a semiconductor chip mounted on a surface of a board and a resin package to cover the semiconductor chip, and further includes solder balls provided as external connection terminals on the other surface of the board.

In order to further pursue miniaturization and increased circuit density of the semiconductor device, pitches between the solder balls need to be further narrowed. Since reliable semiconductor devices are expected, a certain degree of reliability must be maintained even when pitches of the solder balls are further narrowed.

2. Description of the Related Art

Figure 1:
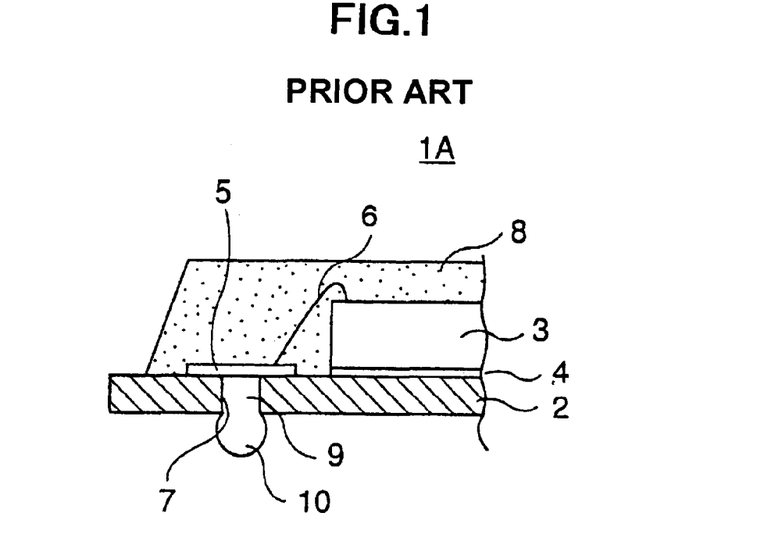
FIG. 1 is an illustrative drawing showing a semiconductor device having a FBGA (fine-pitch ball-grid array) structure.

FIG. 1 is an illustrative drawing showing a semiconductor device 1A having a FBGA (fine-pitch ball-grid array) structure. The semiconductor device 1A of FIG. 1 is an "overmold" type. The semiconductor device 1A mainly includes a board 2, a semiconductor chip 3, a resin package 8, and a solder ball 10.

The board 2 is formed from a resin film, and has the semiconductor chip 3 mounted thereon via an adhesive. The board 2 has a hole 7 formed at a predetermined location thereof. A conductive sheet 5 is formed by plating copper (Cu) or gold (Au) at the hole 7 on the side where the semiconductor chip 3 is mounted. The conductive sheet 5 serves as an electrode, and is hereinafter referred to as an electrode sheet 5. In this configuration, one end of the hole 7 is closed by the electrode sheet 5.

In the hole 7, a via portion 9 is formed by using solder. The via portion 9 is connected to the solder ball 10 to together form a single inseparable part. In this manner, the solder ball 10 is electrically connected to the electrode sheet 5 through the via portion 9. The solder ball 10 serves as an external connection terminal, and is provided to project from the surface of the board 2.

In the semiconductor device 1A of the overmold type as shown in FIG. 1, the semiconductor chip 3 and the electrode sheet 5 are connected by a wire 6. The resin package 8 is formed by using a transfer mold method, for example, and serves to protect the semiconductor chip 3, the electrode sheet 5, and the wire 6.

Figure 2:
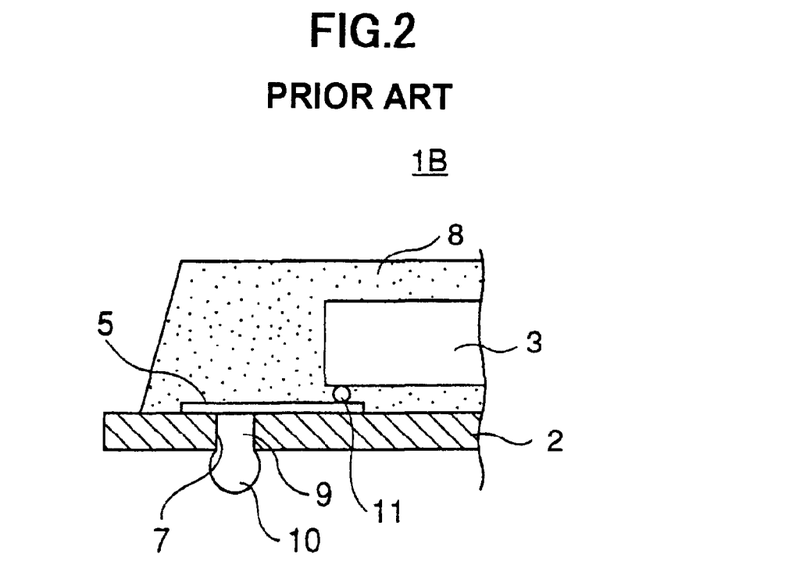
FIG. 2 is an illustrative drawing showing a semiconductor device having a FBGA structure of a flip-chip type.

FIG. 2 is an illustrative drawing showing a semiconductor device 1B having a FBGA structure of a flip-chip type. In the semiconductor device 1B of FIG. 2, a stud bump 11 is formed on the semiconductor chip 3, and is connected to the electrode sheet 5 via flip-chip bonding. In some configurations, a solder bump is used in place of the stud bump 11. In FIG. 2, the same elements as those of FIG. 1 are referred to by the same numerals.

The semiconductor device 1A and the semiconductor device 1B having the FBGA structure described above have the solder ball 10 serving as an external connection terminal. A manufacturing process for forming the semiconductor device 1A or the semiconductor device 1B thus necessarily includes a ball mounting step for mounting the solder ball 10 on the board 2.

Figure 3:
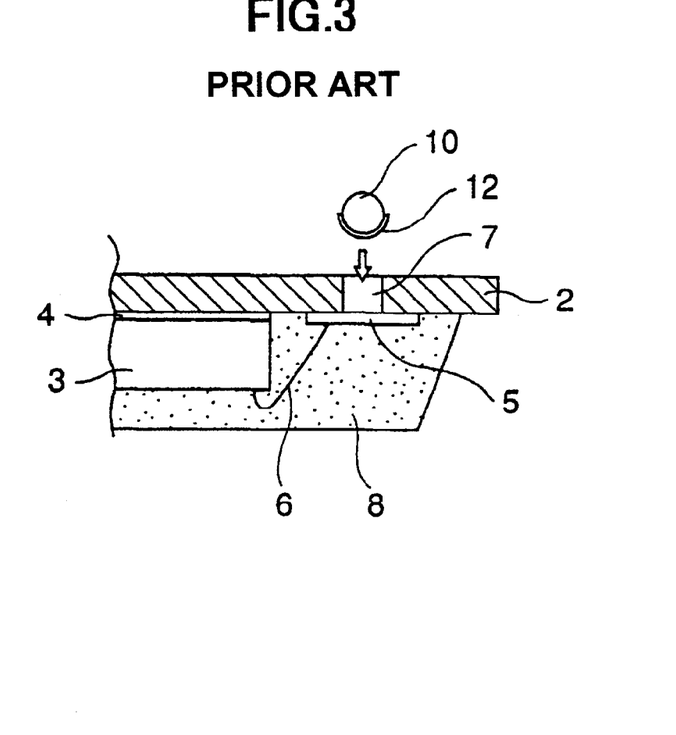
FIGS. 3 through 5 are illustrative drawings showing related-art methods of mounting a solder ball on a board.
Figure 4:
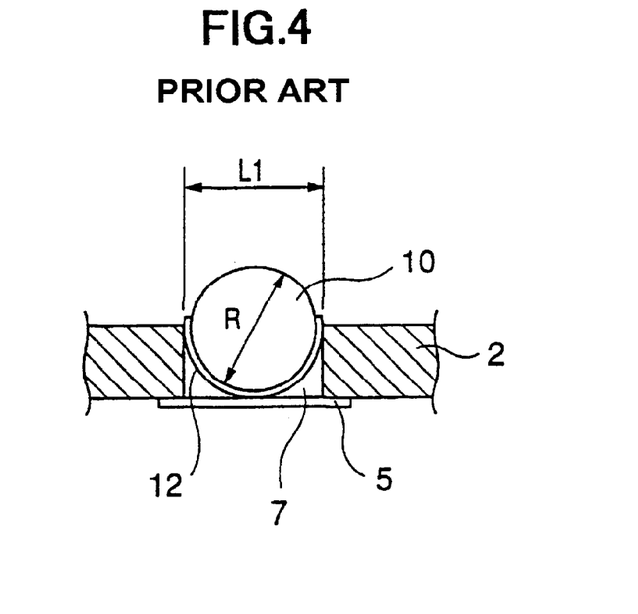
Figure 5:
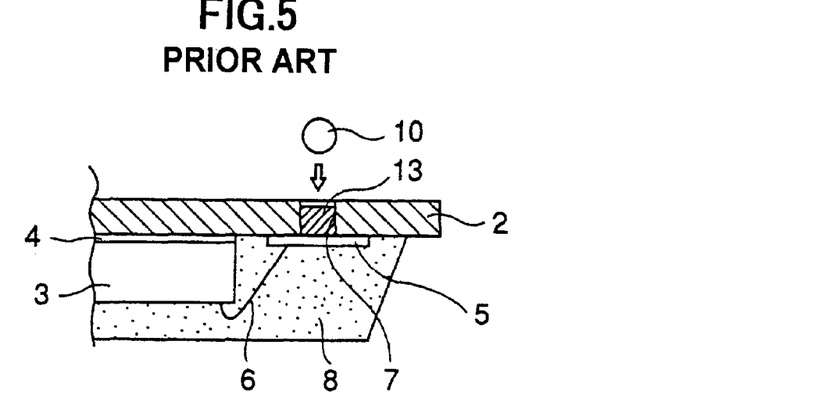

FIGS. 3 through 5 are illustrative drawings showing related-art methods of mounting the solder ball 10 on the board 2. It should be noted that the methods shown in FIGS. 3 through 5 are directed to the semiconductor device 1A of FIG. 1.

In FIG. 3, the solder ball 10 with a flux 12 (or solder paste) applied thereto in advance is inserted into the hole 7 of the board 2. FIG. 4 shows the way the solder ball 10 is inserted into the hole 7.

In the related art, it is possible for adjacent solder balls to have as large a pitch as 0.8 mm therebetween, so that a diameter L1 of the hole 7 can be proportionally large (e.g., can be 0.30 to 0.40 mm). In such a case, a diameter R of the solder ball 10 may generally range from 0.40 mm to 0.50 mm. When the solder ball 10 is inserted into the hole 7, the solder ball 10 may be completely buried in the hole 7, or may be partially but almost entirely cloistered in the hole 7, depending on the diameter R of the solder ball 10.

After the solder ball 10 is inserted into the hole 7, a reflow process (i.e., heating process) is performed to melt the solder ball 10. Since the solder ball 10 is completely or almost entirely cloistered in the hole 7, the melted solder ball 10 fills the hole 7 securely so as to contact the electrode sheet 5. Solder in excess of the volume of the hole 7 forms the solder ball 10 on the board 2 with help of the surface tension. In this manner, the semiconductor device 1A shown in FIG. 1 is created.

FIG. 5 shows another ball mounting method. In this method, the solder paste 13 is provided in the hole 7 by applying a printing method (i.e., a screen printing method) to the board 2. As described above, the diameter L1 of the hole 7 is relatively large in the relate-art configuration, so that the screen printing easily fills the hole 7 with the solder paste 13. Here, the solder paste 13 is a mixture of organic flux and solder powder.

The solder ball 10 is inserted into the hole 7 filled with the solder paste 13, and a reflow process is performed. This disperses organic components from the solder paste 13, and the solder powder is melted to fill the hole 7. The solder ball 10 is also melted so as to blend with the solder in the hole 7. In this manner, the semiconductor device 1A shown in FIG. 1 is created.

As a circuit density of the semiconductor chip 3 is increased, the number of external terminals tends to increase as has been observed in recent years. Also, semiconductor devices are expected to be increasingly smaller in order to produce an ever smaller electronics equipment.

Against this background, pitches between balls in semiconductor devices are now required to be as small as 0.5 mm. In order to achieve this dimension, a diameter L1 of a hole needs to be as small as 0.20 to 0.25 mm, and a diameter of a solder ball needs to be about 0.3 mm.

If the ball mounting method as described in connection with FIGS. 3 and 4 is used in such a small-dimension configuration as described above, an attempt to insert the solder ball 10 into the hole 7 ends up having the solder ball 10 only partially cloistered in the hole 7 because of the relatively small size of the hole 7 compared to the size of the solder ball 10. This creates a large gap between the solder ball 10 and the electrode sheet 5. Because of the size of the gap, the reflow process may not be able to electrically connect the solder ball 10 to the electrode sheet 5.

Figure 6A:
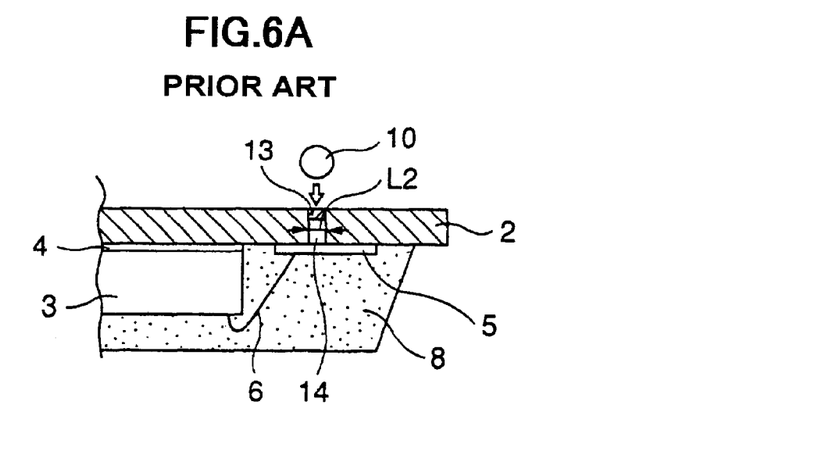
FIGS. 6A and 6B are illustrative drawings showing a case in which the ball mounting method of FIG. 5 is applied to a board having a hole with a diameter of 0.20 mm.
Figure 6B:
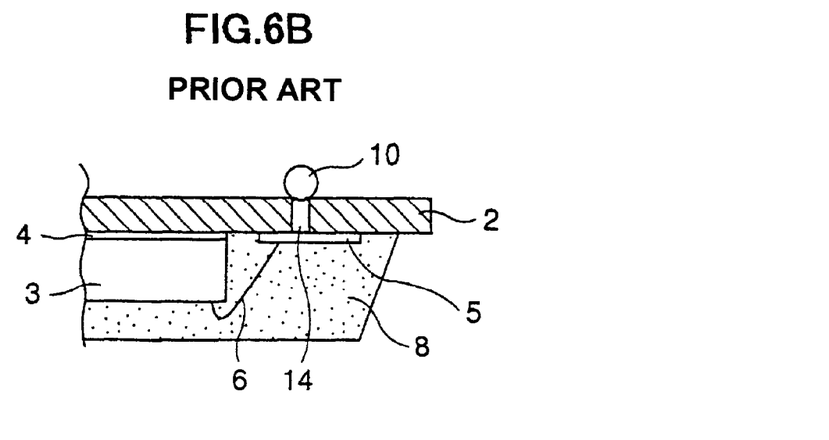

FIGS. 6A and 6B are illustrative drawings showing a case in which the ball mounting method of FIG. 5 is applied to the board 2 having a hole 14 with a diameter L2 of 0.20 mm. As shown in FIG. 6A, an attempt to insert the solder paste 13 in the hole 14 by using a screen printing method fails to sufficiently fill the hole 14 with the solder paste 13 when the diameter L2 of the hole 14 is as small as 0.20 mm to 0.25 mm. Namely, as shown in the figure, the solder paste 13 may be provided only around the end of the hole 14.

When the solder ball 10 is mounted in the hole 14 and a reflow process is then performed, solder of the solder paste 13 is absorbed by the melted solder ball 10, resulting in such a situation as no solder exists inside the hole 14 as shown in FIG. 6B. In this manner, the ball mounting method of FIG. 5 cannot be applied to the board 2 if the hole 14 has a small diameter since the solder ball 10 cannot be appropriately mounted in such a small hole.

Accordingly, there is a need for a method of forming a semiconductor device, a method of forming a circuit board, and a semiconductor-device forming device which can mount solder balls reliably on a board even when a diameter of holes is decreased to shorten pitches between balls.

SUMMARY OF THE INVENTION

Accordingly, it is a general object of the present invention to provide a method of forming a semiconductor device, a method of forming a circuit board, and a semiconductor-device forming device which can satisfy the need described above.

It is another and more specific object of the present invention to provide a method of forming a semiconductor device, a method of forming a circuit board, and a semiconductor-device forming device which can mount solder balls reliably on a board even when a diameter of holes is decreased to shorten pitches between balls.

In order to achieve the above objects according to the present invention, a method of forming a semiconductor device by mounting solder balls on a resin board which has holes formed therethrough and conductive sheets formed therebeneath to cover bottom ends of the holes includes the steps of applying solder paste on the holes, melting the solder paste by heat to make solder of the solder paste flow into the holes and establish contact with the conductive sheets, and connecting the solder balls to the solder filled in the holes.

According to the method described above, the solder paste is printed on the holes, and is melted to let the solder of the solder paste flow into the holes. Since the solder is in a fluid state, the solder securely fills the holes even if the holes have a small diameter such as between 0.2 mm and 0.25 mm. By the same reason, the solder filled in the holes establishes secure electrical connection with the conductive sheet.

Accordingly, when the solder balls are connected to the solder in the holes, secure connection is insured therebetween. This achieves reliable electrical connection between the solder balls and the conductive sheets. In this manner, reliable solder-ball mounting is performed even when the diameter of the holes is small.

According to one aspect of the present invention, the steps of applying the solder paste and melting the solder paste are repeated several times to insure that the solder completely fills the holes.

Further, a method of forming a semiconductor device by mounting solder balls on a resin board which has holes formed therethrough and conductive sheets formed therebeneath to cover bottom ends of the holes includes the steps of applying solder paste on the holes, and melting the solder paste by heat to make solder of the solder paste flow into the holes and establish contact with the conductive sheets and to make the solder of the solder paste in excess of a volume of each of the holes form the solder balls projecting from the resin board.

According to the method described above, the solder paste is applied on the holes in such an amount that the solder of the solder paste exceeds the volume of the holes. The solder in excess of the volume of the holes forms a ball shape due to surface tension, and the ball created in this fashion serves as an external connection terminal.

This allows a single heating step to simultaneously create the hole fillings and the solder balls, thereby achieving an efficient ball mounting process.

Moreover, a method of forming a circuit board by filling metal in holes formed through the circuit board which has conductive sheets formed therebeneath to cover bottom ends of the holes includes the steps of applying solder paste on the holes, and melting the solder paste by heat to make solder of the solder paste flow into the holes and establish contact with the conductive sheets.

The method described above forms the circuit board offering reliable electrical connections by the same reasons previously described even when the diameter of the holes is small.

According to one aspect of the present invention, the step of melting the solder pastes in all the methods described above is performed with respect to the holes that have an exposed resin surface as an inside wall thereof. Since there is no good familiarity between the solder and the resin surface in terms of surface contact, the solder flowing into the holes goes down all the way to the conductive sheets without being stuck to the inside wall halfway through the hole. This prevents generation of a void inside the holes.

Furthermore, a method of forming a circuit board by filling metal in holes formed through the circuit board comprising filling the metal in the holes by a plating process. This method further includes a step of forming a conductive sheet on the circuit board by the plating process at the same time as filling the metal in the holes.

In the method described above, the step of filling the metal in the holes is simultaneously performed with the step of forming the conductive sheets (wiring pattern). This simplifies the process of forming the circuit board.

Moreover, a device for forming a semiconductor device by mounting solder balls on a resin board which has holes formed therethrough and conductive sheets formed therebeneath to cover bottom ends of the holes includes a paste printing unit configured to apply solder paste on the holes, a heating unit configured to melt the solder paste by heat to make solder of the solder paste flow into the holes and establish contact with the conductive sheets, and a ball mounting unit configured to connect the solder balls to the solder filled in the holes.

The device as described above can practice the method of efficiently forming the semiconductor device as previously described.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

FIGS. 7A through 7D are illustrative drawings showing a first embodiment of a method of forming a semiconductor device according to the present invention. In FIGS. 7A through 7D, the same elements as those of FIGS. 1 through 6 are referred to by the same numerals, and a description thereof will be omitted. The method of forming a semiconductor device according to the present invention differs from the related-art method only in the ball mounting step for mounting the solder ball 10 on the board 2, and a description will be given below only with regard to the ball mounting step.

Figure 7A:
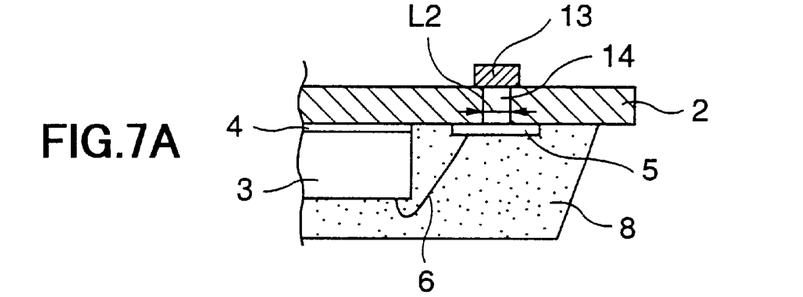
FIGS. 7A through 7D are illustrative drawings showing a first embodiment of a method of forming a semiconductor device according to the present invention.

In order to mount the solder ball 10 on the board 2 according to the present invention, the solder paste 13 is printed on the hole 14 formed in the board 2 as shown in FIG. 7A. A screen printing method may be employed for this purpose. In detail, a printing-purpose mask 34 and a skeege 35 are used to print the solder paste 13 on the hole 14 (see FIG. 13). The solder paste 13 on the hole 14 is provided in such an amount that solder of the solder paste 13 fills in the hole 14 just completely.

The first embodiment is directed to a semiconductor device in which the ball pitches range from 0.3 mm to 0.5 mm and the hole 14 has the diameter L2 thereof ranging from 0.2 mm to 0.25 mm. Because of the small diameter L2 of the hole 14, the solder paste 13 when printed on the hole 14 by the screen printing method is unlikely to get its way into the hole 14, but is likely to stay outside the hole 14.

Figure 7B:
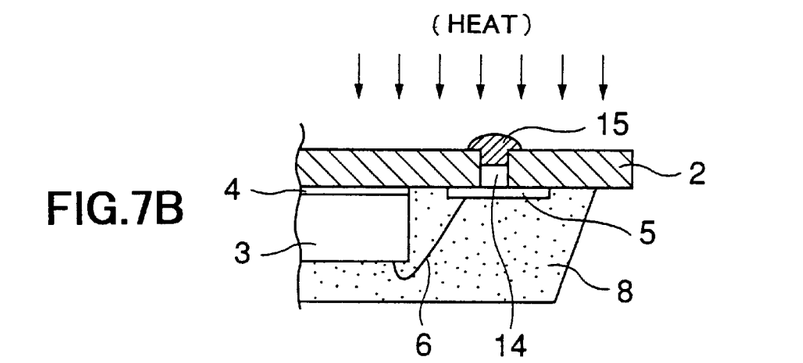

After the printing of the solder paste 13 is completed, a process of heating the solder paste 13 is performed as shown in FIG. 7B. The process of heating the solder paste 13 preferably employs a partial melting scheme such as a heater melting (see FIG. 13) using a heater 36 or a laser melting using a laser beam in order to reduce damage inflicted on the resin-based board 2 and the semiconductor chip 3.

Figure 7C:
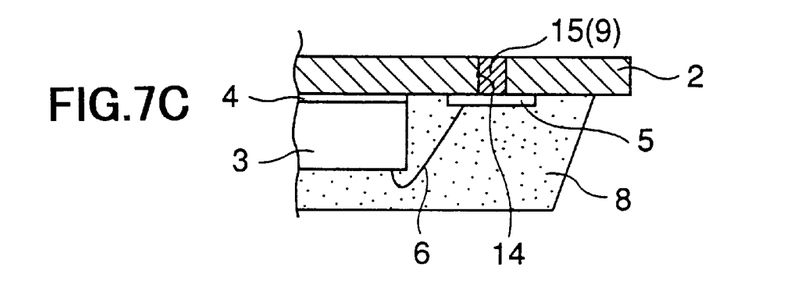

In the heating process, organic components of the solder paste 13 are dispersed, and the solder powder is melted to become solder 15 flowing into the hole 14. Since the solder 15 is melted to become a fluid, the solder 15 gets its way into and securely fills the hole 14 as shown in FIG. 7C even though the ball pitches are small (from 0.3 mm to 0.5 mm) and the diameter L2 of the hole 14 are thus as small as between 0.2 mm and 0.25 mm. By the same reason, the solder 15 filling the hole 14 securely establishes electrical contact with the electrode sheet 5 (conductive sheet). This step of the process may be referred to as a filling step. The solder 15 filling the hole 14 forms the via portion 9 shown in FIG. 1.

Figure 7D:
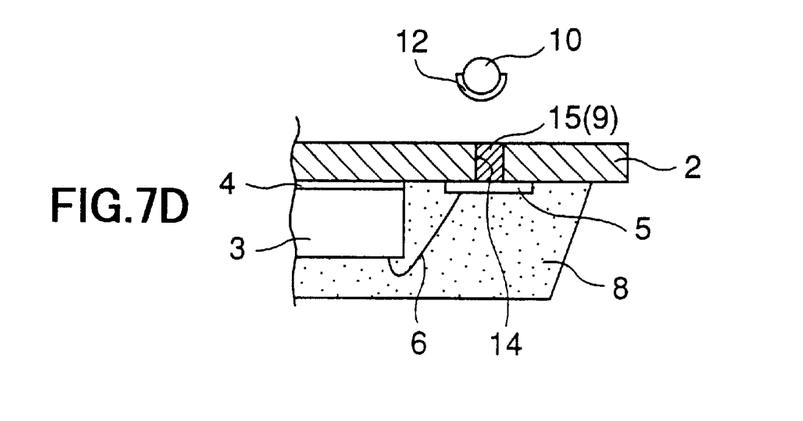

After the end of the filling step, a ball connecting step is performed to connect the solder ball 10 to the solder 15 filled in the hole 14. At this ball connecting step, the solder ball 10 with the flux 12 (or solder paste) attached thereto in advance is tentatively fastened to the solder 15 in the hole 14 as shown in FIG. 7D. A reflow process is then performed to securely connect the solder ball 10 to the solder 15. In this manner, the semiconductor device 1A as shown in FIG. 1 is obtained.

Prior to connecting the solder ball 10 to the solder 15, the solder paste 13 is subjected to a high temperature melting process at the filling step, and, thus, the solder 15 fills the hole 14 completely. This makes it possible to securely connect the solder ball 10 to the solder 15 and to establish a reliable electrical connection between the solder ball 10 and the electrode sheet 5 via the solder 15. In this manner, the present invention reliably mounts the solder ball 10 on the board 2 even when the hole 14 has a relatively small diameter. This allows semiconductor device 1A to be manufactured at a high yield in a reliable fashion.

The above embodiment has been described with reference to a method of forming the semiconductor device 1A shown in FIG. 1. It is apparent that the same embodiment is applicable to forming of the semiconductor device 1B shown in FIG. 2.

Figure 8A:
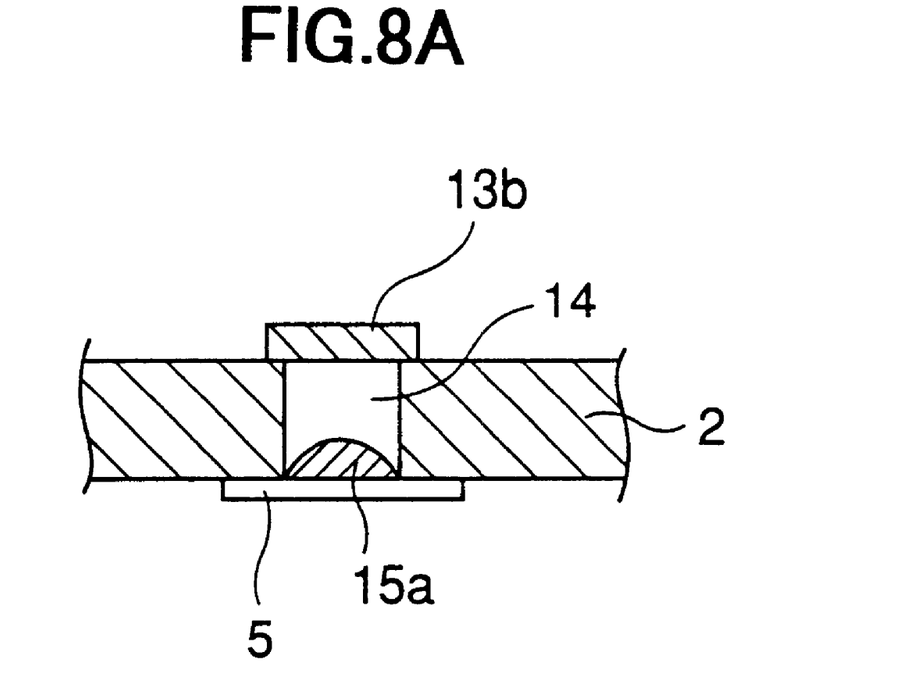
FIGS. 8A and 8B are illustrative drawings showing a variation of the ball mounting step of FIGS. 7A through 7D.
Figure 8B:
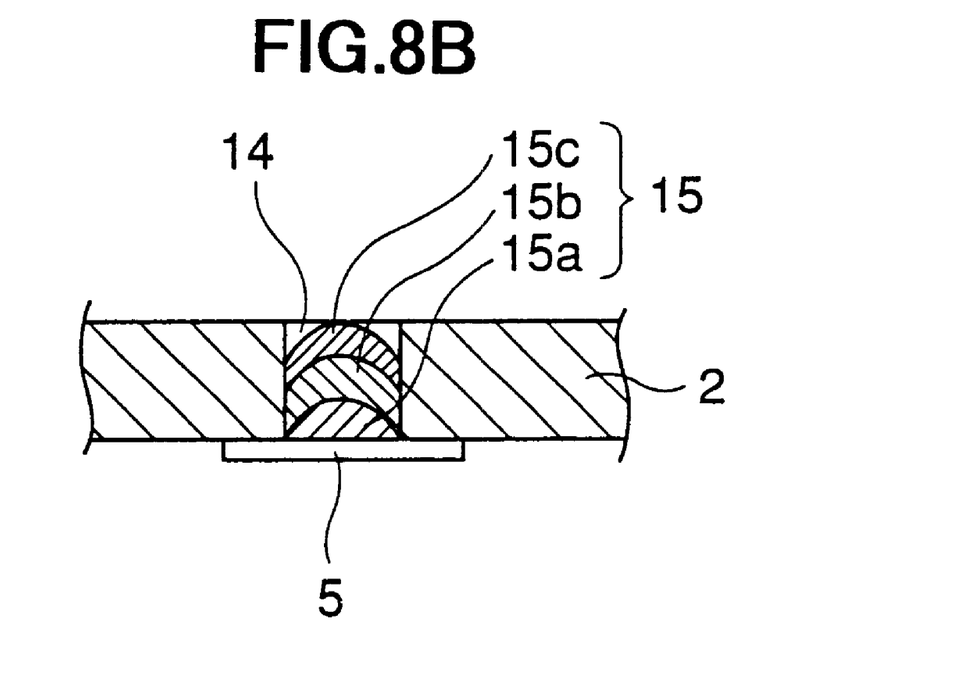

FIGS. 8A and 8B are illustrative drawings showing a variation of the ball mounting step.

The ball mounting step described in connection with FIGS. 7A through 7D includes only one filling step as shown in FIGS. 7A through 7C. If the diameter L2 of the hole 14 is small, and if the hole 14 formed through the board 2 has a long extension because of a thickness of the board 2, a single filling step may not be sufficient to insure that the solder 15 completely fills the hole 14.

In this variation of the ball mounting step, the filling step is repeated several times so as to insure that the solder 15 fills the hole 14 securely. FIG. 8A shows a situation in which a first-layer solder 15a is formed inside the hole 14 through a first filling step, and a second-layer solder paste 13b is printed thereafter. A heating process is performed while every element is in place as shown in FIG. 8A, so that solder powder of the second-layer solder paste 13b is melted and flows into the hole 14. This creates a second-layer solder 15b on the first-layer solder 15a.

FIG. 8B shows a situation obtained after performing the filling process three times. In FIG. 8B, the first-layer solder 15a through a third-layer solder 15c are formed inside the hole 14, so that the solder 15 comprised of these three layers almost completely fills the hole 14. In this manner, repeating the filling step several times makes sure that the solder securely fills the hole 14.

A through-hole electrode is a well-known instrumentation which connects electrically between an upper surface and a lower surface of a board. The through-hole electrode is comprised of a liner (such as copper film) formed on an inner wall of a hole when the hole is formed through the board. When the first embodiment as described above is applied to such a hole with a through-hole electrode, a problem is encountered as will be described below.

Figure 9A:
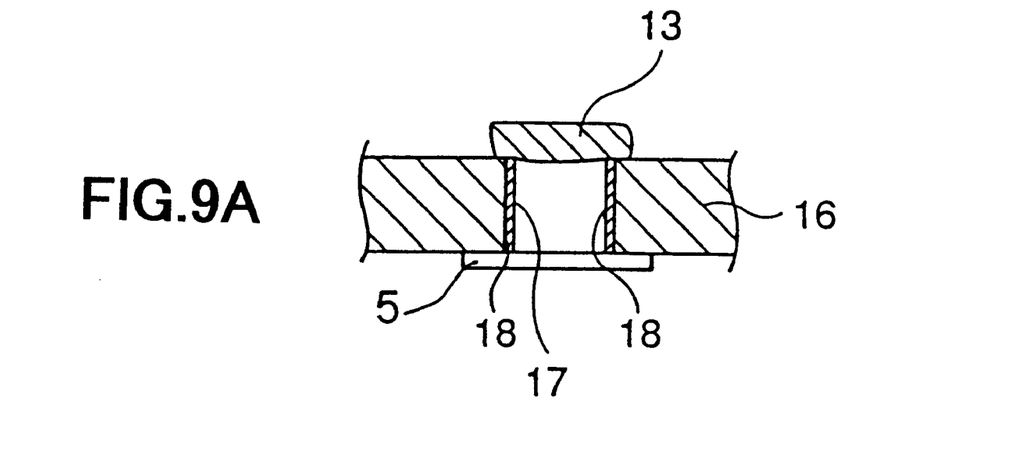
FIGS. 9A through 9C are illustrative drawings for explaining a problem which is encountered when the filling process of the present invention is applied to a hole with a through-hole electrode.
Figure 9B:
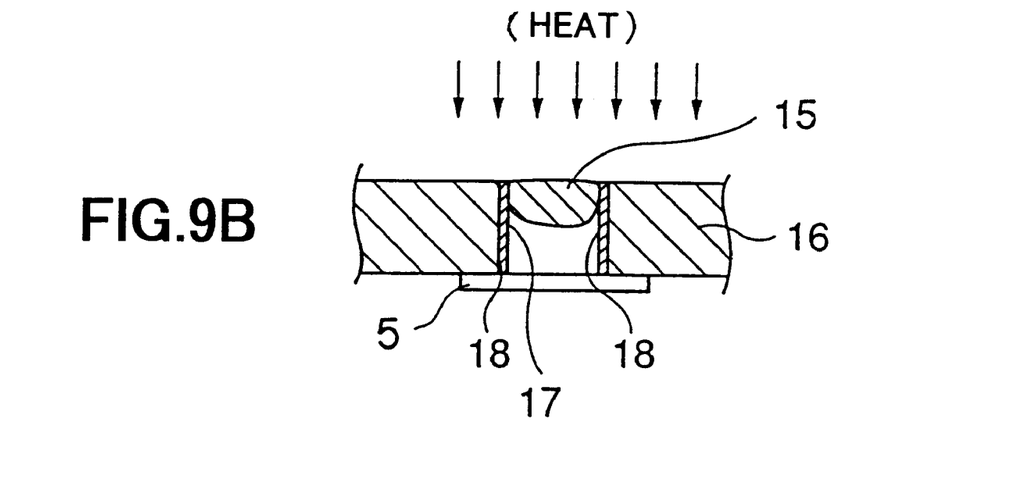
Figure 9C:
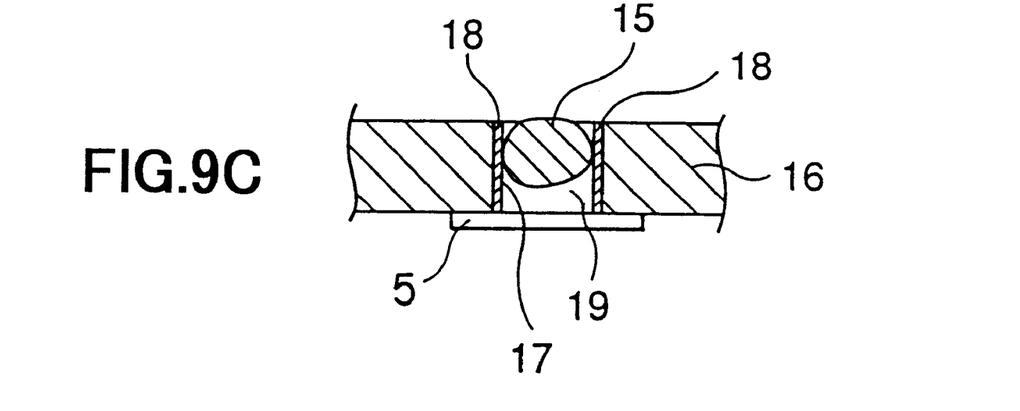

FIGS. 9A through 9C are illustrative drawings for explaining a problem which is encountered when the filling process of the present invention is applied to a hole with a through-hole electrode.

FIG. 9A shows a situation in which the solder paste 13 is printed on a hole 17 having an inner plating film 18 coated on an inside wall thereof. As a heating process is carried out as shown in FIG. 9B, solder powder of the solder paste 13 is melted and flows into the hole 17.

Since the inner plating film 18 is provided on the inside wall of the hole 17, the solder 15 stops short of going down to the bottom, and is stuck to the inner plating film 18 halfway through the hole 17. This is because there is a good familiarity in terms of surface contact between the inner plating film 18 and the solder 15. In this case, as shown in FIG. 9C, a void 19 is created at the bottom of the solder 15. Namely, the solder 15 does not completely fill the hole 17.

In the first embodiment of the present invention, however, no plating film is formed on the inner wall of the hole 14, thereby allowing the resin board 2 to be exposed. Since the inner wall of the hole 14 is an exposed surface of the resin board 2, the solder 15 flowing into the hole 14 goes all the way down to the bottom where the electrode sheet 5 is situated without being stuck to the inner wall of the hole 14. This is because there is no good surface familiarity between resin and the solder 15. In this manner, the first embodiment of the present invention avoids creation of a void inside the hole 14 when the solder 15 is inserted.

In what follows, a method of forming a semiconductor device according to a second embodiment of the present invention will be described.

Figure 10A:
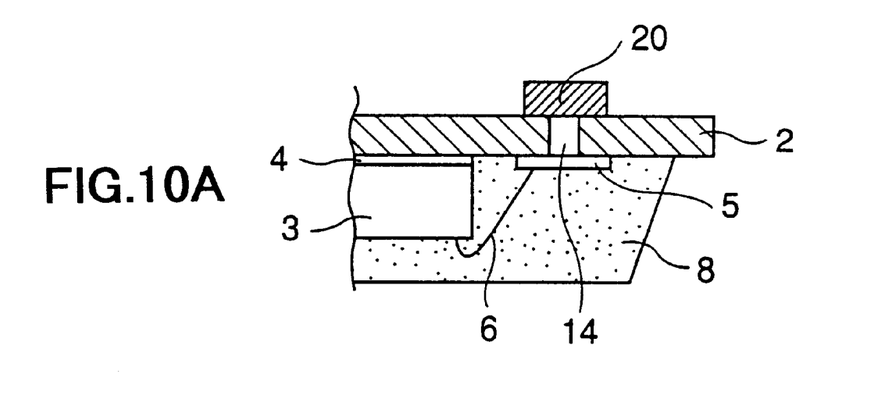
FIGS. 10A through 10C are illustrative drawings showing a second embodiment of a method of forming a semiconductor device according to the present invention.
Figure 10B:
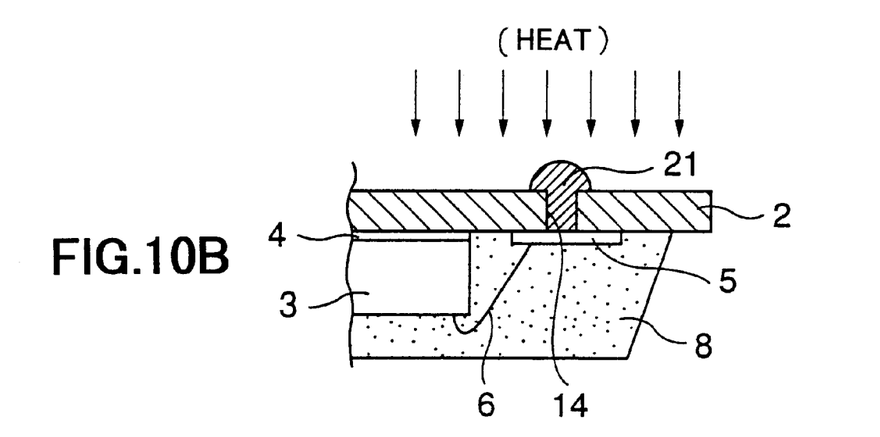
Figure 10C:
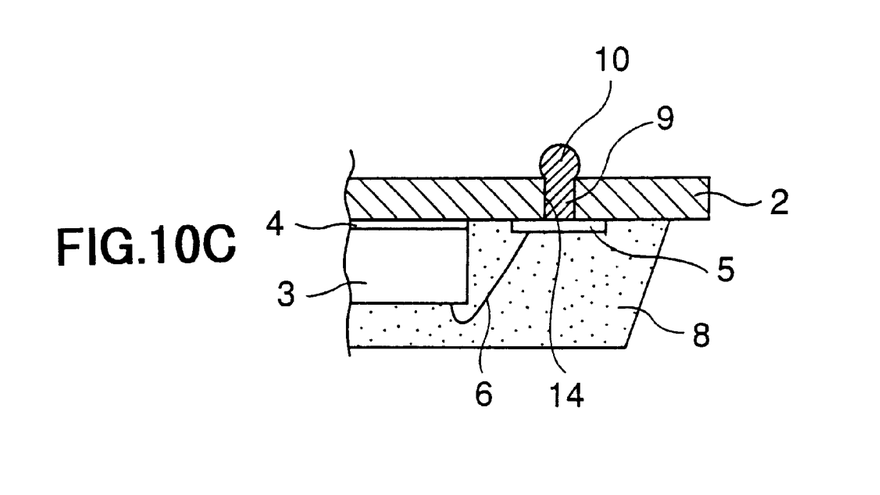

FIGS. 10A through 10C are illustrative drawings showing a second embodiment of a method of forming a semiconductor device according to the present invention. In FIGS. 10A through 10C, the same elements as those of FIGS. 7A through 7D are referred to by the same numerals, and a description thereof will be omitted. The method of forming a semiconductor device according to this embodiment differs from the related-art method only in the ball mounting step for mounting the solder ball 10 on the board 2, and a description will be given below only with regard to the ball mounting step.

In the first embodiment described in connection with FIGS. 7A through 7D, when the solder paste 13 is printed during the filling step, the amount of the solder paste 13 printed on the hole 14 is adjusted so as to be just sufficient for the solder of the solder paste 13 to fill the hole 14 completely.

In the second embodiment, on the other hand, solder paste 20 is provided on the hole 14 in an amount larger than the volume of the hole 14 during a solder printing step for providing the solder paste 20 on the hole 14.

FIG. 10A shows the step of providing solder paste. The amount of the solder paste 20 provided on the hole 14 is greater than the volume of the hole 14. Here, adjustment of the amount of the solder paste 20 on the hole 14 can be made by thickening the printing-purpose mask 34 used in the printing process and/or enlarging a mask hole formed at a position where the solder paste 20 is printed.

After an end of the solder-paste providing step, a heating and melting process is performed to melt solder power of the solder paste 20 as shown in FIG. 10B. Solder 21 having turned into a fluid state flows into the hole 14.

Since the solder paste 20 is provided in a larger amount than the volume of the hole 14 at the solder-paste providing step, the solder 21 has a bulk thereof in excess of the via portion 9 formed inside the hole 14 as shown in FIG. 10B. The excessive solder 21 forms a ball shape because of surface tension so as to create the solder ball 10 as shown in FIG. 10C. The solder ball 10 projects from the board 2, and, thus, can be used as an external connection terminal.

In the first embodiment described in connection with FIGS. 7A through 7D, the first heating process for melting the solder paste 13 and the second heating process for connecting the solder ball 10 to the solder 15 in the hole 14 were necessary. In the second embodiment, on the other hand, the heating and melting processing is performed only once to melt the solder paste 20 (to create the via portion 9) and to create the solder ball 10. This achieves efficient mounting of the solder ball 10 on the board 2, and, thus, leads to simpler and more efficient manufacturing steps for forming the semiconductor device 1A.

It should be noted that the filling step may be repeated several times in the second embodiment in the same fashion as in the first embodiment. This insures that the solder 21 completely fills the hole 14.

In the following, a first embodiment of a method of forming a circuit board according to the present invention will be described.

Figure 11A:
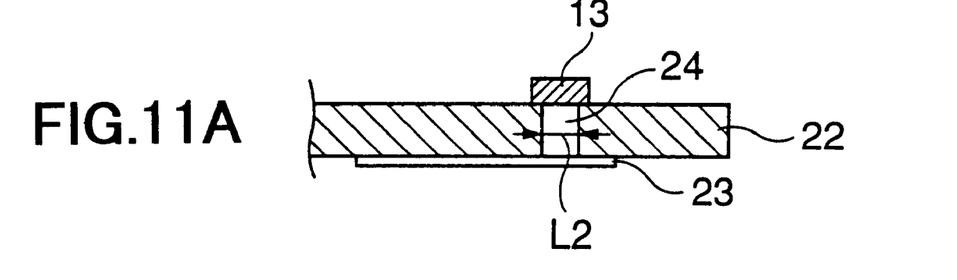
FIGS. 11A through 11C are illustrative drawings showing a first embodiment of a method of forming a circuit board according to the present invention.
Figure 11B:
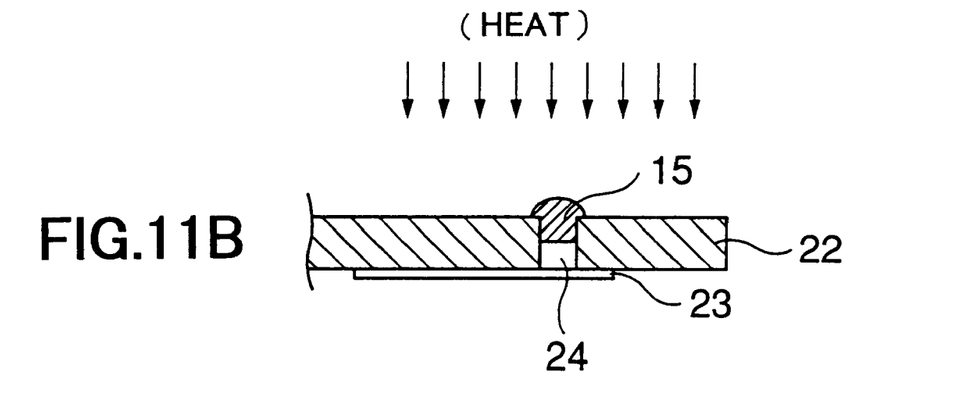
Figure 11C:
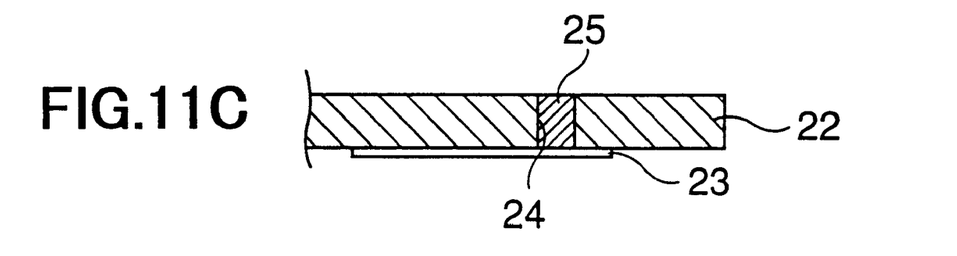

FIGS. 11A through 11C are illustrative drawings showing a first embodiment of a method of forming a circuit board according to the present invention. In FIGS. 11A through 11C, the same elements as those of previous figurers are referred to by the same numerals, and a description thereof will be omitted. The method of forming a circuit board according to this embodiment differs from the relate-dart method only in a filling step for filling a solder via 25 in a hole 24 formed through a circuit board 22, and a description will be given below only with regard to this filling step.

In order to fill the hole 24 with the solder via 25 according to this embodiment, a printing step is first performed to print the solder paste 13 on the hole 24 formed in the board 22 as shown in FIG. 11A. A screen printing method may be employed for this purpose as in the method of forming a semiconductor device previously described. The solder paste 13 on the hole 24 is provided in such an amount that solder of the solder paste 13 fills in the hole 24 just completely.

The first embodiment is directed to a circuit board in which the hole 24 has the diameter thereof ranging from 0.2 mm to 0.25 mm. Further, the circuit board 22 is provided with a wiring pattern 23 formed thereon. A portion of the wiring pattern 23 covers one of the two ends of the hole 24.

After the printing of the solder paste 13 is completed, a heating and melting process is performed to melt solder powder included in the solder paste 13 as shown in FIG. 11B. The process of heating the solder paste 13 preferably employs a partial melting scheme such as a heater melting using a heater or a laser melting using a laser beam in order to reduce damage inflicted on the resin-based circuit board 22.

In the heating process, organic components of the solder paste 13 are dispersed, and the solder powder is melted to become solder 15 flowing into the hole 24. Since the solder 15 is melted to become a fluid, the solder 15 gets its way into and securely fills the hole 24 as shown in FIG. 11C even though the diameter L2 of the hole 24 is as small as between 0.2 mm and 0.25 mm, thereby creating the solder via 25 in a good shape without a void. By the same reason, the solder 15 filling the hole 24 securely establishes electrical contact with the wiring pattern 23.

Further, the hole 24 of this embodiment has an inner wall that is an exposed surface of the resin circuit board 22, so that there is no good familiarity with the solder 15. The solder 15 flowing into the hole 24 thus goes all the way to the wiring pattern 23 without being stuck to the inner wall of the hole 24. This helps to prevent generation of a void inside the hole 24 when the solder 15 is filled in. It should be noted, also, that the filling step can be repeated several times in this embodiment so as to insure that the solder via 25 is securely created inside the hole 24.

The circuit board created in this manner can be used for carrying a SAW-filter package thereon, for example.

In the following, a second embodiment of a method of forming a circuit board according to the present invention will be described.

Figure 12:
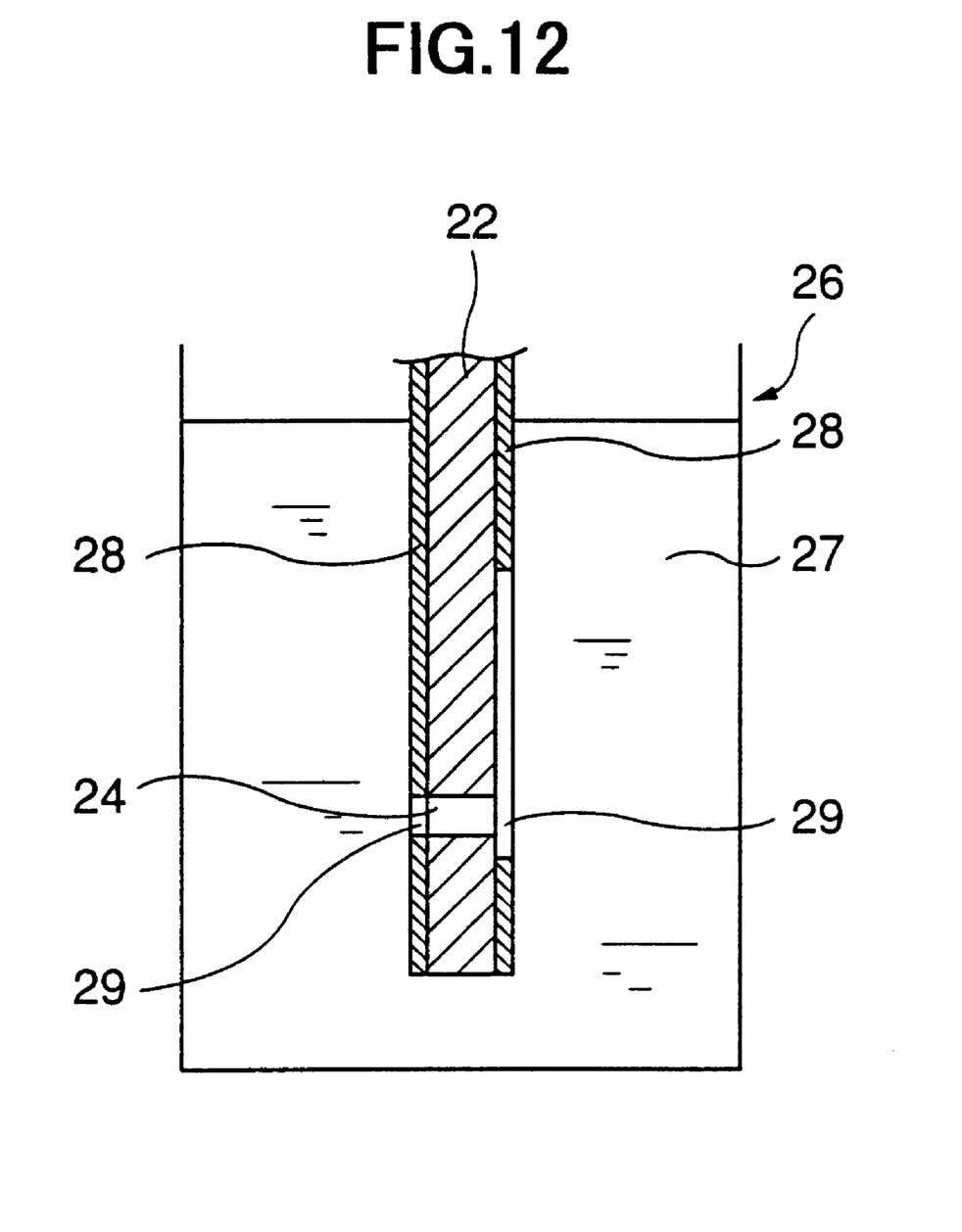
FIG. 12 is an illustrative drawing showing a second embodiment of a method of forming a circuit board according to the present invention.

FIG. 12 is an illustrative drawing showing a second embodiment of a method of forming a circuit board according to the present invention. In FIG. 12, the same elements as those of FIGS. 11A through 11C are referred to by the same numerals, and a description thereof will be omitted. The method of forming a circuit board according to this embodiment differs from the related-art method only in the filling step for filling a via (contact metal) in the hole 24 formed through the circuit board 22, and a description will be given below only with regard to this filling step.

The second embodiment has one of its features in that the via is formed inside the hole 24 through a plating technique. In detail, a plating-purpose mask 28 is first formed on the circuit board 22 as shown in FIG. 12. The plating-purpose mask 28 has mask holes 29 at positions where the hole 24 is formed in the circuit board 22 and where a wiring pattern is to be formed on the circuit board 22.

The circuit board 22 with the plating-purpose mask 28 formed thereon is immersed in plating liquid 27 contained in a plating container 26, so that non-electro plating is carried out. Metal (e.g., copper) is plated at positions where the mask holes 29 are provided. This creates a copper via inside the hole 24 and a wiring pattern at a desired position.

In this manner, the via is filled inside the hole 24 through a plating technique, so that a reliable result is insured even when the diameter of the hole 24 is as small as ranging from 0.2 mm to 0.25 mm. Further, the formation of the via is performed concurrently with the formation of a wiring pattern, thereby simplifying manufacturing steps for forming the circuit board 22.

In the embodiment described above, non-electro plating scheme is employed. It is apparent, however, that an electroplating technique may be used as an alternative by providing proper electrodes to the circuit board.

In the following, an embodiment of a semiconductor-device forming device will be described.

Figure 13:
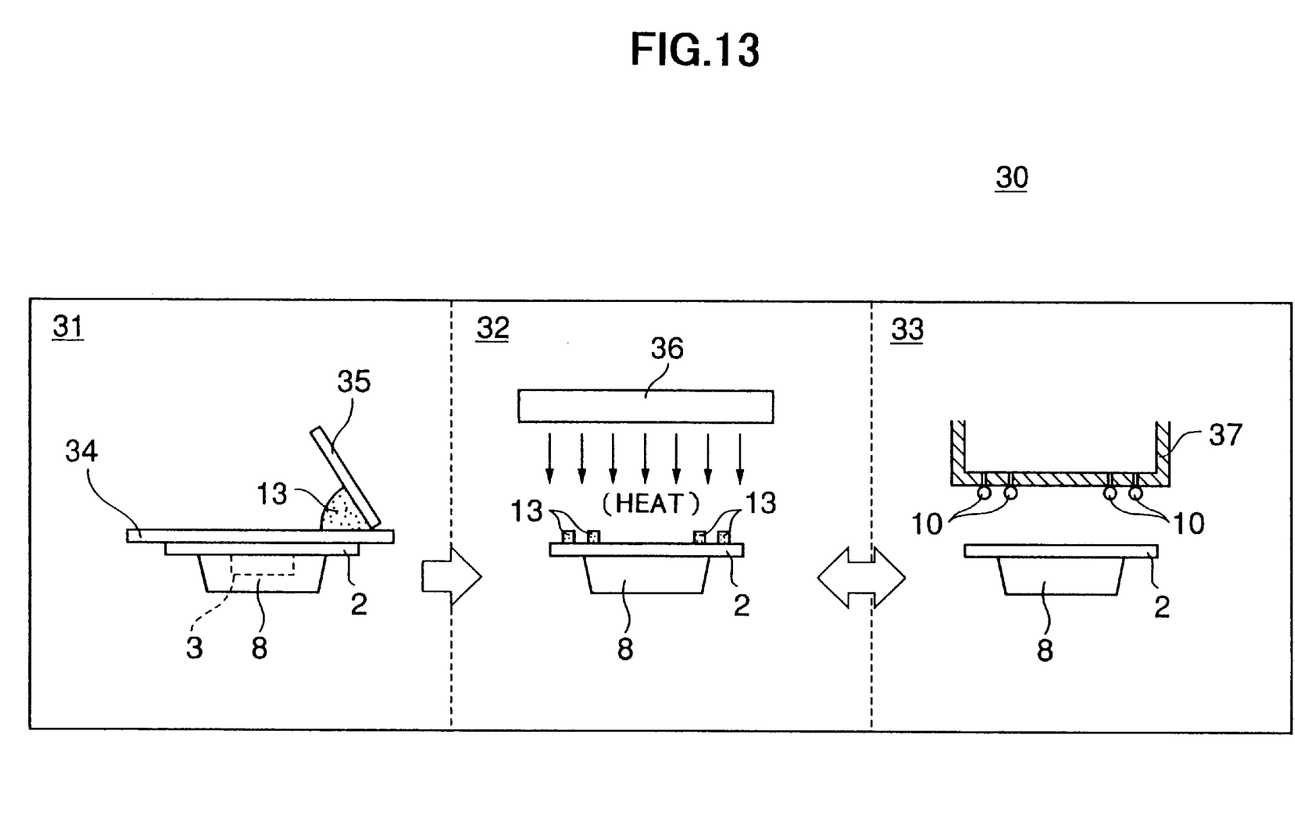
FIG. 13 is an illustrative drawing showing schematic configuration of a semiconductor-device forming device according to the present invention.

FIG. 13 is an illustrative drawing showing schematic configuration of a semiconductor-device forming device 30. The semiconductor-device forming device 30 performs the process of forming a semiconductor device according to the first embodiment or the second embodiment described in connection with FIGS. 7A through 7D or FIGS. 10A through 10C, respectively. The same elements as those of FIGS. 7A through 7D or FIGS. 10A through 10C are referred to by the same numerals, and a description thereof will be omitted.

The semiconductor-device forming device 30 basically includes a paste printing unit 31, a heating unit 32, and a ball mounting unit 33. The paste printing unit 31 includes the printing-purpose mask 34 and the skeege 35. When the board 2 carrying the semiconductor chip 3, the resin package 8, etc., is mounted on the paste printing unit 31, the printing-purpose mask 34 is attached to the board 2, and the printing process is performed by the skeege 35 to apply the solder paste 13. The printing-purpose mask 34 has mask holes at positions where the holes 14 are formed in the board 2. The printing process thus prints the solder paste 13 on the holes 14.

After the paste printing unit 31 completes printing of the solder paste 13, the board 2 having the solder paste 13 applied thereto is conveyed to the heating unit 32 by a conveyor unit (not shown). In this embodiment, the heater 36 capable of partial heating is employed as a heating unit. As previously described, a laser-based device may be used as a heating unit. The heating unit 32 heats and melts the solder paste 13 so as to let the solder 15 flow into the holes 14.

After the heating unit 32 finishes the process of filling the hole 14 with the solder 15, a conveyor unit (not shown) conveys the board 2 to the ball mounting unit 33. The ball mounting unit 33 is provided with a ball carrying fixture 37. The ball carrying fixture 37 has sucking holes at positions corresponding to the holes 14 formed in the board 2, and the solder balls 10 are sucked and stuck to the sucking holes by atmospheric decompression.

The ball carrying fixture 37 is moved downward after positioning thereof is secured, so that the solder balls 10 are placed on the solder 15 which fills the holes 14. Then, the conveyor unit (not shown) brings the board 2 back to the heating unit 32, where a heating process is carried out. The solder balls 10 and the solder 15 are melted and merged together, thereby creating the semiconductor device 1A (or 1B).

As described above, the semiconductor-device forming device 30 includes the paste printing unit 31 for applying the solder paste 13 to the holes 14 of the board 2, the heating unit 32 for heating and melting the solder paste 13 so as to let the solder 15 flow into the hole 14 and for merging the solder 15 with the solder balls 10, and the ball mounting unit 33 for mounting the solder balls 10 on the solder 15 in the hole 14. Through operations of these three units, the semiconductor-device forming device 30 can perform the process of mounting balls according to the first or second embodiment, thereby achieving an efficient ball mounting process.

Further, the present invention is not limited to these embodiments, but various variations and modifications may be made without departing from the scope of the present invention.

The present application is based on Japanese priority application No. 10-240650 filed on Aug. 26, 1998, with Japanese Patent Office, the entire contents of which are hereby incorporated by reference.

What is claimed is:

1. A method of forming a semiconductor device by mounting solder balls on a resin board which has holes formed therethrough and conductive sheets formed therebeneath to cover bottom ends of the holes, said method comprising the steps of:

a) applying a singular amount of solder paste in excess of a volume of each of the holes directly on the holes using a mask having mask holes, each of said mask holes having a volume corresponding to said singular amount; and b) melting the solder paste by heat to make solder of the solder paste flow into the holes and establish contact with the conductive sheets and to make the solder of the solder paste in excess of the volume of each of the holes form the solder balls projecting from the resin board, wherein said step b) is performed with respect to the holes having an inside wall that is an exposed resin surface of the resin board.

2. The method as claimed in claim 1, wherein pitches of the solder balls mounted on the resin board range substantially from 0.3 mm to 0.5 mm.

3. The method as claimed in claim 1, wherein a diameter of the holes is smaller than about 0.25 mm.

4. The method as claimed in claim 1, wherein the mask is any or both of a thickened printing-purpose mask and an enlarged mask hole formed at a position where the solder paste is printed.

* * * * *